United States Patent
Dai et al.

(10) Patent No.: US 6,469,585 B1
(45) Date of Patent: Oct. 22, 2002

(54) LOW PHASE NOISE RING-TYPE VOLTAGE CONTROLLED OSCILLATOR

(75) Inventors: Liang Dai; Ramesh Harjani, both of Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 09/624,929

(22) Filed: Jul. 25, 2000

(51) Int. Cl.[7] .................... H03B 5/24; H03H 11/26
(52) U.S. Cl. ............... 331/57; 331/177 R; 327/276; 327/281
(58) Field of Search .................. 331/57, 177 R; 327/270, 272, 274, 276, 281, 287, 288

(56) References Cited

U.S. PATENT DOCUMENTS

| | | |
|---|---|---|
| 5,180,994 A | 1/1993 | Martin et al. ............ 331/38 |
| 5,841,325 A | 11/1998 | Knotts et al. ............ 331/57 |
| 5,917,383 A | 6/1999 | Tso et al. ............... 331/57 |
| 6,043,719 A * | 3/2000 | Lin et al. .............. 331/57 |
| 6,104,254 A * | 8/2000 | Iravani ................ 331/57 |

OTHER PUBLICATIONS

Aytur et al., "FA 15.4: A 2GHz, 6mW BiCMOS Frequency Synthesizer," *IEEE International Solid–State Conference*, 1995, pp. 264–265.

Hajimiri et al., *IEEE Journal of SOlid–State Circuits*, 1998, 33(2):179–194.

Park et al., *IEEE Journal of Solid–State Circuits*, 1999, 34(5):586–591.

Razavi, *IEEE Journal of Solid–State Circuits*, 1996, 31(3):331–343.

Razavi, "A 2–GHz 1.6–mW Phase–Locked Loop," *1996 Symposium on VLSI Circuits Digest of Technical Papers*, pp. 26–27.

Thamsirianunt et al., *IEEE Journal of Solid–State Circuits*, 1997, 32(10):1511–1524.

* cited by examiner

*Primary Examiner*—David Mis
(74) *Attorney, Agent, or Firm*—Fish & Richardson, P.C., P.A.

(57) ABSTRACT

A delay stage used in a ring-type voltage-controlled oscillator has an inverter, a memory element, and tuning circuitry. The memory element is coupled to the output of the inverter to delay the time before the inverter's output begins to switch states in response to the inverter's input switching states. The tuning circuitry receives a control voltage and is coupled to the inverter to alter the strength of the inverter without altering the strength of the memory element. Altering the strength of the tuning circuitry alters the delay of the delay stage, and hence the frequency of the VCO's operation. Because the strength of the memory element is not altered, the speed at which the inverter's output switches remains substantially constant at all tuned frequencies. The switching speed is primarily dictated by the $F_T$ of the process.

9 Claims, 3 Drawing Sheets

LOW PHASE NOISE RING-TYPE VOLTAGE CONTROLLED OSCILLATOR

TECHNICAL FIELD

This invention relates to ring-type voltage-controlled oscillators (VCO's), and more particularly to ring-type VCO's with reduced phase noise.

BACKGROUND

Phase-locked loops (PLL's) are analog building blocks used extensively in many analog and digital communication systems. Some applications of PLL's are frequency synthesizers, analog and digital modulators and demodulators, and clock recovery circuits, to name a few. A PLL, a typical design for which is shown in FIG. 1, includes a VCO, which is a circuit that produces an ac output signal whose frequency is proportional to an input control voltage. Random fluctuations in the output phase of the VCO, in terms of phase noise, are undesirable in most applications. The phase noise in a VCO output can result in cross-talk in a wireless communications system, and it can also result in increased bit error rates in a wired communications system. It is particularly difficult to meet the stringent phase noise requirements for communicating at high frequencies and high data rates.

VCO's fabricated with GaAs or bipolar technology, and using high-quality discrete components, have been widely used for many years to obtain high operation frequencies with acceptable noise performance. Recently, as switching speeds of complementary metal-oxide (CMOS) processes have increased sufficiently, the design of VCO's in CMOS is becoming attractive, because manufacturing is less expensive and designing the VCO in CMOS allows greater integration with other CMOS digital circuitry. CMOS VCO's of LC-tank type have recently been studied, but have barriers. For example, implementing the high-quality inductor needed for a LC-tank VCO in a standard CMOS process consumes significant silicon area. More importantly, LC-tank VCO's in CMOS generally have narrow tuning ranges, and so performance is sensitive to process variations.

Another type of VCO is known as a ring-type VCO. A ring-type VCO is realized by placing a number of inverting amplifiers in a feedback loop. Each inverting amplifier adds delay to the feedback loop, and the amount of delay added by the inverters dictates the frequency at which the ring-type VCO operates. The greater the delay, the lower the frequency. Ring-type VCO's do not use inductors and have a greater tuning range, and so do not have the processing limitations that LC-tank VCO's have. However, given the lack of high-quality resonant elements in a ring-type VCO, designing a CMOS ring-type VCO with acceptable phase noise poses a challenge. In addition, there is a direct trade-off between power consumption and VCO phase noise performance. It is desirable to minimize the phase noise for a given power consumption budget.

Recently, CMOS ring oscillators have been proposed and studied. For example, CMOS ring oscillators that utilize a memory element in an inverter delay stage have been proposed. See Thamsirianunt et al., "CMOS VCO's for PLL Frequency Synthesis in GHz Digital Mobile Radio Communications," in IEEE Jnl. Of Solid-State Circuits, Vol. 32, No. 10, October 1997, pp. 1511–24, especially FIG. 6 on p. 1515; Park et al. "A Low-Noise, 900-MHz VCO in 0.6-$\mu$m CMOS," in IEEE Jnl. Of Solid-State Circuits, Vol. 34, No. 5, May 1999, 586–91, especially FIGS. 2 and 4($a$) on pp. 587 and 588. In these CMOS ring VCO's utilizing a delay stage with a memory element, the outputs of the inverter delay stages are generally in the form of a square wave. As such, the output of each inverter delay stages include periods of switching (from LOW to HIGH, and then from HIGH to LOW), and periods during which the inverter stages are either LOW or HIGH. In the prior CMOS ring-type oscillator designs shown in Thamsirianunt et al. and Park et al., the delay of delay elements is dictated by tuning the strength of the memory element based on the control voltage. Because the strength of the memory element also dictates the speed at which the output switches, tuning the strength of the memory element to achieve a longer delay (and hence a slower frequency) has the effect of increasing the switching time.

In addition, differential control of a VCO typically involves the use of two control voltage terminals—$V_{CNTRL+}$ and $V_{CNTRL-}$. The frequency of oscillation is determined by the voltage difference (differential mode voltage) between the two control voltage terminals and is not affected by common-mode voltage of the two control voltage terminals. Differential control has been used in VCO design, and in fact has been used in one proposed ring-type VCO design. See Razavi, "A Study of Phase Noise in CMOS Oscillators," in IEEE Jnl. of Solid-State Circuits, Vol. 31, No. 3, March 1996, pp. 331–43, especially p. 335 and FIG. 10. In the ring-type VCO proposed by Razavi, the proposed fully differential control uses a differential pair. This design may not be applicable for high-speed switching topologies, and because of the additional voltage drop across the differential pair, the design is not suited for low voltage operation.

SUMMARY OF THE INVENTION

In one aspect, the invention is a delay stage used in a ring-type VCO. The delay stage has an inverter, a memory element, and tuning circuitry. The inverter receives a signal from another delay stage and provides an output also to another delay stage. The memory element is coupled to the output of the inverter to delay the time before the output begins to switch states in response to the inverter's input switching states. The amount of this delay depends on the relative strengths of the inverter and the memory element. The tuning circuitry is coupled with the inverter to alter the inverter's strength, thereby altering the delay time, while the strength of the memory element is held substantially constant. Because the design and strength of the memory element substantially dictates the switching speed, the invention allows increased switching speed to be maintained regardless of the tuned delay. And because phase noise is generated during the switching time, maintaining the increased switching speed serves to reduce phase noise.

In another aspect, the invention is a ring-type VCO utilizing an even number of delay stages that each have a memory element, wherein each of the delay stages has differential outputs. As such, the VCO provides useful quadrature outputs. In addition, and in another aspect, the invention incorporates differential control, which reduces substrate and power-supply-generated phase noise.

The invention affords one or more of the following advantages. Phase noise is reduced for a design that can be easily implemented in low-power-consuming processes like CMOS. The invention makes less-expensive VCO designs more easily realizable.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
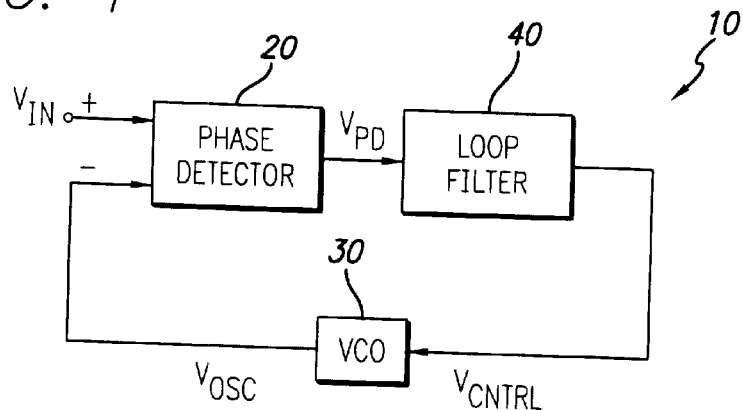
FIG. 1 is a block diagram of a PLL circuit that may embody some aspects of the invention.

A phase-locked loop (PLL) 10, shown in FIG. 1, is a system that uses feedback to maintain an output signal ($V_{OSC}$) in a specific phase relationship with a reference signal ($V_{IN}$). A typical PLL 10 includes a phase detector 20 whose output ($V_{PD}$) has an average value proportional to the phase difference between an input signal ($V_{IN}$) and an output signal ($V_{OSC}$) of a voltage-controlled oscillator (VCO) 30. A loop filter 40 amplifies and filters the phase detector output ($V_{PD}$) and produces a control voltage ($V_{CNTRL}$) used to drive the VCO 30. The negative feedback of the loop results in the output ($V_{OSC}$) of the VCO 30 being synchronized in frequency with the input signal ($V_{IN}$)

Figure 2:
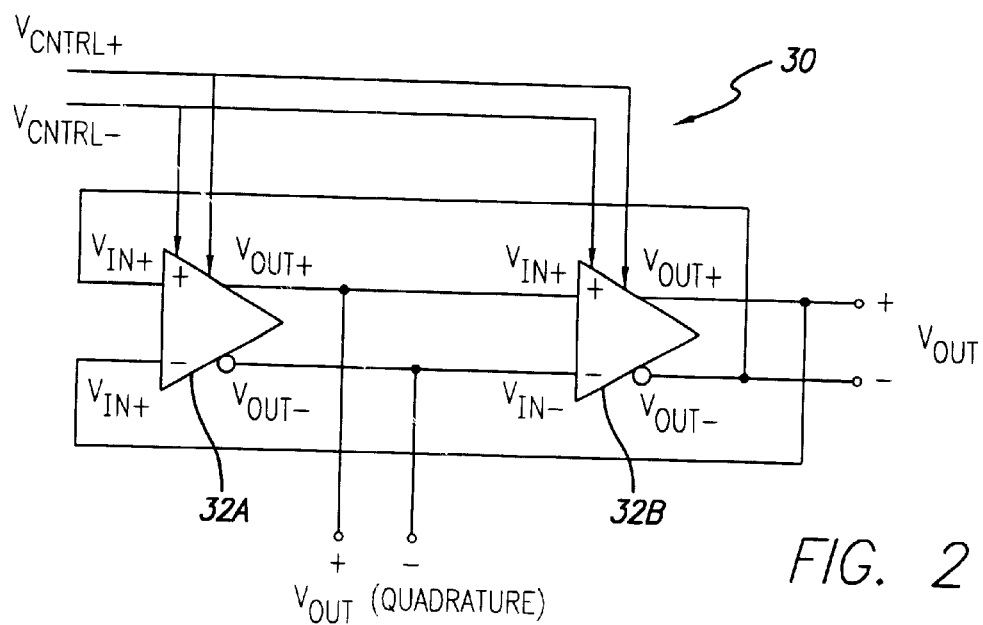
FIG. 2 is a block diagram of a ring-type VCO circuit, in accordance with an embodiment of the invention, for use with the PLL circuit of FIG. 1.

The VCO 30 in accordance with an embodiment of the invention, shown in more detail in FIG. 2, is a ring-type VCO. The VCO 30 includes two identical delay stages 32A and 32B, each having two differential differential inputs $V_{IN+}$ and $V_{IN-}$ and two differential outputs $V_{OUT+}$ and $V_{OUT-}$. Differential inputs $V_{IN+}$ and $V_{IN-}$ are 180° out of phase with one another, as are differential outputs $V_{OUT+}$ and $V_{OUT-}$. Differential output $V_{OUT+}$ of delay stage 32A is fed to the positive input of delay stage 32B, whose differential output $V_{OUT+}$ is in turn fed back to the negative input of delay stage 32A. Similarly, differential output $V_{OUT-}$ of delay stage 32A is fed to the negative input of delay stage 32B, whose differential output $V_{OUT-}$ is in turn fed back to the positive input of delay stage 32A. As such, each and every differential output $V_{OUT+}$ and $V_{OUT-}$ from each delay stage 32A and 32B will switch between HIGH and LOW values. Each delay stage 32A and 32B causes a 90° phase shift, and so the phase shifts relative to $V_{OUT+}$ of delay stage 32A are as follows—$V_{OUT+}$ of delay stage 32B is shifted 90°, $V_{OUT-}$ of delay stage 32A is shifted 180°, and $V_{OUT-}$ of delay stage 32B is shift 270°. The VCO 30 thus incorporates quadrature outputs, which are used extensively in both wireless and wired communications systems.

The control voltage (VCONTR) used in the PLL 10 (see FIG. 1) may be a differential control scheme, in which VCONTR consists of two control voltages, $V_{CONTR+}$ and $V_{CONTR-}$ (see FIG. 2). Both differential control voltages $V_{CNTRL+}$ and $V_{CNTRL-}$ are received by each delay stage 32A and 32B. It has been found that there is typically large power supply and substrate noise due to digital circuits on the same silicon substrate, but that this noise affects both control voltages $V_{CNTRL+}$ and $V_{CNTRL-}$ equally. Therefore, using differential control serves to prevent phase noise resulting from power supply and substrate variations. In particular, the noise incident on each control voltage $V_{CNTRL+}$ and $V_{CNTRL-}$ tends to cancel out the other.

Figure 3:
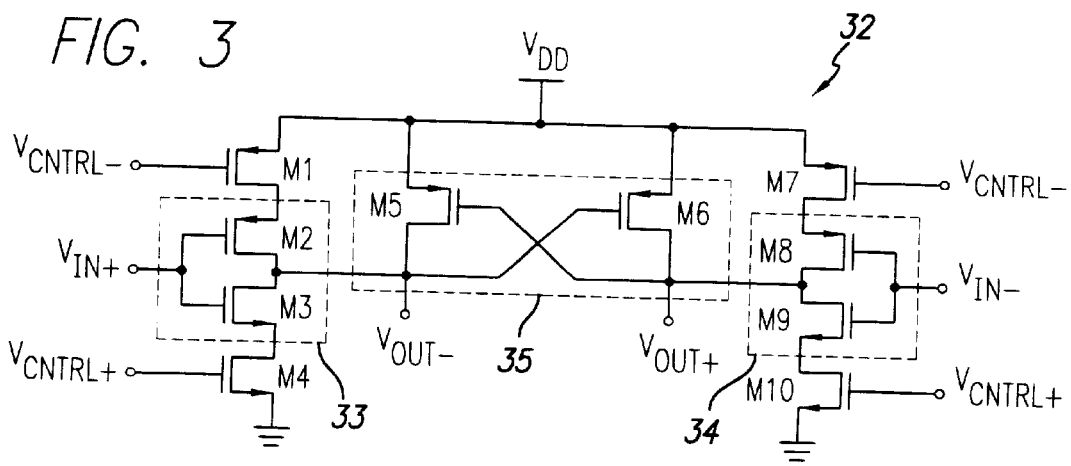
FIG. 3 is a schematic diagram of a delay stage for the circuit of FIG. 2, in accordance with an embodiment of the invention.

FIG. 3 shows the design of delay stages 32A and 32B of FIG. 2, in accordance with the invention. Recalling that delay stages 32A and 32B are the same, reference numeral 32 of FIG. 3 corresponds to both delay stages 32A and 32B. Delay stage 32 is fabricated in CMOS, and thus includes p-channel and n-channel devices on the same monolithic integrated circuit. Delay stage 32 receives differential inputs $V_{IN+}$ and $V_{IN-}$ at CMOS inverters 33 and 34, respectively, which produce at their inverter outputs differential outputs $V_{OUT+}$ and $V_{OUT-}$. Inverters 33 and 34 each consist of a PMOS transistor (M2 for inverter 33 and M8 for inverter 34) connected in series, drain-to-drain, with an NMOS transistor (M3 for inverter 33 and M9 for inverter 34). Each transistor pair M2/M3 and M8/M9 also has a common gate to receive the respective differential input $V_{IN+}$ and $V_{IN-}$.

Delay stage 32 also includes frequency tuning circuitry including PMOS transistors M1 and M7 and NMOS transistors M4 and M10. PMOS transistors M1 and M7 each receive $V_{CNTRL-}$ at their gates, and function as variable resistors to tune the amount of delay of the delay stage 32, and hence the frequency of the VCO 30. The source terminals of PMOS transistors M1 and M7 are connected to power supply $V_{DD}$; the drain terminal of PMOS transistor M1 is connected to the source terminal of PMOS transistor M2 of inverter 33; and the drain terminal of PMOS transistor M7 is connected to the source terminal of PMOS transistor M8 of inverter 34. In similar fashion to PMOS transistors M1 and M7, NMOS transistors M4 and M10 each receive $V_{CNTRL+}$ at their gates, and function as variable resistors to tune the amount of delay of delay stage 32. The source terminals of NMOS transistors M4 and M10 are connected to ground; the drain terminal of NMOS transistor M4 is connected to the source terminal of NMOS transistor M3 of inverter 33; and the drain terminal of NMOS transistor M10 is connected to the source terminal of NMOS transistor M9 of inverter 34.

Delay stage 32 further includes a memory element 35, which consists of two cross-coupled PMOS transistors M5 and M6. The source terminals of PMOS transistors M5 and M6 are each connected to power supply $V_{DD}$. The gate of PMOS transistor M5 receives $V_{OUT+}$ (or in other words, receives the output of inverter 34), and is also connected to the drain terminal of PMOS transistor M6. Similarly, the gate of PMOS transistor M6 receives $V_{OUT-}$ (or in other words, receives the output of inverter 33), and is also connected to the drain terminal of PMOS transistor M5. The function of the memory element 35, generally, is two-fold. First, memory element 35 causes the outputs of inverters 33 and 34 (this is, differential outputs $V_{OUT+}$ and $V_{OUT-}$) to resist switching states. Second, once switching of the inverter 33 and 34 outputs begin, memory element 35 provides positive feedback so as to decrease the time it takes for the inverter 33 and 34 outputs to switch.

Figure 4:
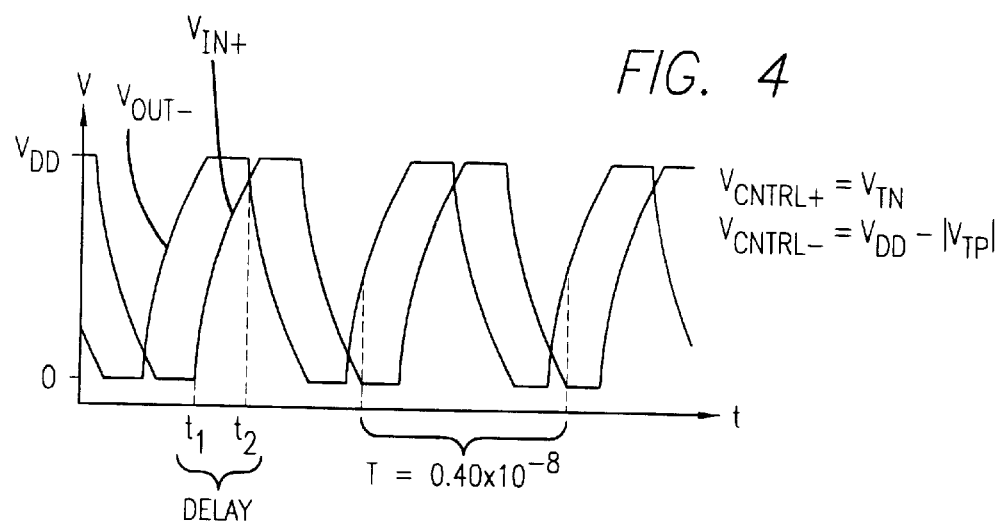
FIGS. 4 and 5 is a timing diagram illustrating the operation of the FIG. 3 circuit.
Figure 5:
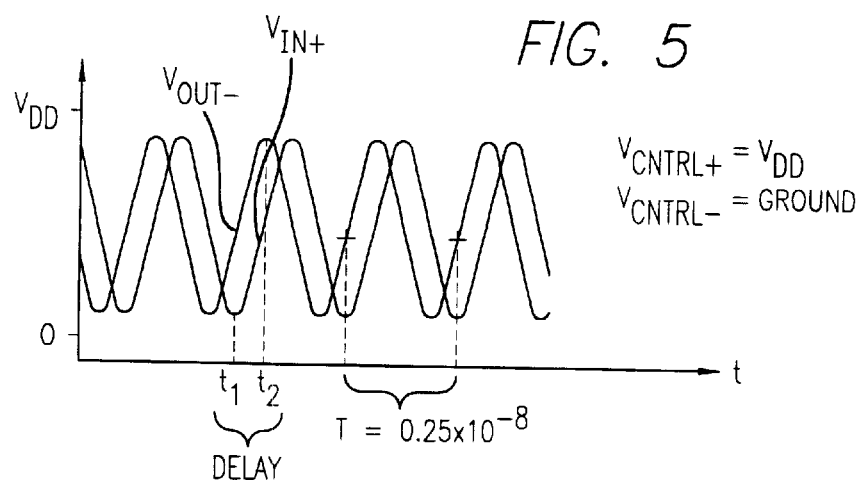

The operation of the delay stage 32 can be understood with the aid of the timing diagrams of FIG. 4 and 5, which each show $V_{IN+}$ and $V_{OUT-}$ plotted versus time. For clarity, the plots of FIGS. 4 and 5 do not show $V_{IN-}$ and $V_{OUT+}$, but it will be understood that plots of $V_{IN-}$ and $V_{OUT+}$ will look like the plots of $V_{IN+}$ and $V_{OUT-}$ except 180° out of phase. FIG. 4 shows the operation of delay stage 32 in a low-frequency case, where the delay of delay stage 32 is at its maximum. FIG. 5 shows the operation of delay stage 32 in a high-frequency case, where the delay of stage 32 is at its minimum. Differential control voltages $V_{CNTRL+}$ and $V_{CNTRL-}$ affect the amount of delay of delay stage 32. Control voltage $V_{CNTRL+}$ preferably varies in the range from $V_{TN}$ (the threshold voltage of NMOS transistors M4 and M10) to $V_{DD}$, and control voltage $V_{CNTRL-}$ preferably varies in the range from $V_{DD}-|V_{TP}|$ to ground ($V_{TP}$ being the threshold voltage for PMOS transistors M1 and M7). The values of $V_{CNTRL+}$ and $V_{CNTRL-}$ in the case shown in FIG. 4 are $V_{TN}$ and $V_{DD}-|V_{TP}|$, respectively, and in the case of FIG. 5, $V_{DD}$ and ground, respectively.

Referring to FIG. 4, it is seen that both $V_{IN+}$ and $V_{OUT-}$ are oscillating. As an example, the period of oscillating (T) may be $0.40 \times 10^{-8}$ Sec, which corresponds to a frequency of 250 MHz. Initially, we look at input $V_{IN+}$ at a point when it is 0 V (for example, just prior to time $t_1$). At this time, $V_{OUT-}$ is nearly equal to $V_{DD}$ (3.0 V, for example, is common in CMOS), as $V_{OUT-}$ has nearly completed its previous switching cycle. Although not shown in FIG. 4, at this point, $V_{IN-}$, the inverse of $V_{IN+}$, is equal to $V_{DD}$, and $V_{OUT+}$ is nearly ground, having nearly completed its previous switching cycle. Accordingly, NMOS transistor M3 is OFF, and NMOS transistor M9 is ON. PMOS transistor M2 is ON; however, because no current flows through NMOS transistor M3 from drain to source, no current flows through PMOS transistor M2 from source to drain. PMOS transistor M5 is ON, though like PMOS transistor M2, no current flows through PMOS transistor M2 from source to drain, because no current flows through NMOS transistor M3. PMOS transistors M8 and M6 are both OFF, because $V_{IN-}$ and $V_{OUT-}$ are both HIGH.

Still referring to FIG. 4, at $t_1$, input voltage $V_{IN+}$ begins rising, and when $V_{IN-}$ reaches the threshold voltage $V_{TN}$ of NMOS transistor M3 (0.7 V, for example), NMOS transistor M3 begins to conduct. Very little current will conduct, however, owing to the small gate voltage received at the gate of NMOS transistor M4. NMOS transistor M4 functions as a variable resistor, as mentioned above, and so there appears a voltage drop across NMOS transistor M4, from drain to source, although the voltage drop will in the case of the conditions shown in FIG. 4, be negligible given the small value of $V_{CNTRL+}$. Because current, albeit a relatively negligible amount, is now beginning to flow from drains to sources through NMOS transistors M3 and M4, current also begins to flow from sources to drains through PMOS transistors M1 and M2, and also from source to drain through PMOS transistor M5. PMOS transistor M1, like NMOS transistor M4, functions as a variable resistor, and so when current conducts from source to drain through PMOS transistor M1, a voltage drop will appear across PMOS transistor M1 from source to drain. Again however, in the case shown in FIG. 4, that voltage drop will be negligible, because of the value of $V_{CNTRL-}$.

For an ordinary CMOS inverter without a memory element as with the invention, the inverter's output would switch at $V_{DD}/2$. The memory element 35 in the configuration shown in FIG. 3 operates to prevent the outputs of inverters 33 and 34 from switching states when they otherwise would switch. In other words, memory element 35 causes switching to be delayed. As can be seen in FIG. 4, differential output $V_{OUT-}$ does not begin to switch until $t_2$, when $V_{IN+}$ is nearly $V_{DD}$. The delay before the outputs of inverters 33 and 34 begin switching (equal to $t_2$ minus $t_1$) is a function of the relative strength of the memory element 35 versus the strength of inverters 33 and 34. In accordance with the invention, the strength of inverters 33 and 34 is variable and dependent upon the control voltage received by the tuning transistors M1, M4, M7 and M10, whereas the strength of the memory element 35 remains relatively constant as it is tied, in the case of FIG. 3, to the power supply voltage $V_{DD}$. In the case of FIG. 4 where the values of $V_{CNTRL+}$ and $V_{CNTRL-}$ cause negligible voltage drop across the tuning transistors M1, M4, M7 and M10 as $V_{IN+}$ and $V_{IN-}$ are changing states, the voltage drop across inverters 33 and 34 from the source of the PMOS transistor M2 or M8 to the source of the NMOS transistor M3 or M9 is at its maximum, which makes the inverters 33 and 34 weaker compared to a case where non-negligible voltage drops appear across tuning transistors M1, M4, M7 and M10.

The speed at which different output $V_{OUT-}$ switches from $V_{DD}$ to ground is a function of the memory element 35 design and the transition frequency (FT) of the CMOS process. There are two primary and competing goals in the design of memory element 35. First, the memory element 35 needs to have sufficient strength to delay the outputs of inverters 33 and 34 from switching. Second, when switching of the outputs of inverters 33 and 34, it is desirable for the switching to occur as fast as possible. It is desirable for switching to be as fast as possible because it has been found that phase noise contributors occur during the switching, and so minimizing the switch time reduces phase noise. The circuit arrangement of the invention serves such objectives by providing reduced switching time, and hence reduced phase noise.

The speed at which the differential outputs $V_{OUT-}$ and $V_{OUT+}$ switch more particularly depends on parasitic capacitances at $V_{OUT-}$ and $V_{OUT+}$. Generally, it is a goal to maximize the transconductance (gm) of the PMOS transistors M5 and M6, which dictates the switch speed, but without adding to the parasitic capacitance at $V_{OUT+}$ and $V_{OUT-}$, or increasing phase noise added by virtue of having additional components. Transconductance (gm) is maximized by constructing PMOS transistors M5 and M6 wider and shorter. However, there is a limit to how wide and short PMOS transistors M5 and M6 can be constructed, because at some point, CMOS inverters 33 and 34 will no longer be able to pull their respective outputs to change state. In addition, even before this limit is reached, parasitic capacitances will slow down the switching.

Now describing the operation of CMOS inverter 34 in the case shown in FIG. 4, assume $V_{IN-}$ is initially at $V_{DD}$. At this time, although NMOS transistor M9 is ON, no current flows through NMOS transistor M9 because both PMOS transistors M8 and M6 are OFF. As such, at this time there is also no voltage drop across either NMOS transistor M9 or M10. Then, the input $V_{IN-}$ begins to fall, and when $V_{IN-}$ falls to $V_{DD}$ minus the threshold voltage of PMOS transistor M8, PMOS transistor M8 turns ON. As such, current begins to conduct through PMOS transistor M8, and hence through NMOS transistors M9 and M10. Again, no current flows through PMOS transistor M6, because it still is OFF. Because of the values of $V_{CNTRL+}$ and $V_{CNTRL-}$ in for the low-frequency case, the voltage drops across PMOS transistors M1 and M7 and NMOS transistors M4 and M10 will all be negligible. In similar fashion to output $V_{OUT-}$, the output $V_{OUT+}$ will begin to transition from ground to $V_{DD}$ when $V_{IN-}$ has nearly reached ground.

FIG. 5 shows the higher frequency case, which means that the delay of delay stage 32 is shorter. In this case, $V_{CNTRL-}$ may be, for example, at ground, whereas $V_{CNTRL+}$ may be at $V_{DD}$. Again, the input $V_{IN+}$ and output $V_{OUT-}$ oscillate, for example, at a frequency of 400 MHz (where the period T is 0.25×10$^{-8}$ Sec). In this case, current conducting through PMOS transistors M1 and M7 and NMOS transistors M4 and M10 will cause a greater voltage drop across these transistors. In the case shown in FIG. 5, the voltage drop across PMOS transistor M1 may be, as an example, about 200 mV at the time output $V_{OUT-}$ begins to switch, as is the voltage drop across NMOS transistor M4. Because now the inverters 33 and 34 are stronger, owing to the smaller voltage drop from the source of the PMOS transistors M2 or M8 to the drain of the NMOS transistors M3 or M9, output $V_{OUT-}$ begins to switch earlier. As can be seen, the time delay ($t_2-t_1$) for the case of FIG. 5 is reduced from that in the case shown in FIG. 4.

Importantly, while it can be seen from FIGS. 4 and 5 that the delay times ($t_2-t_1$) vary, the switching speeds remain substantially the same. This is because it is the memory element 35 and its strength that dictates the speed of the switching. In accordance with the invention, the relative strengths of the inverters 33 and 34 versus the memory element 35 is altered by changing the strength of the inverters 33 and 34. This contrasts with the prior art where it was the strength of a memory element that was altered to alter delay. Thus, in the prior art in the case of lower frequencies, the time it takes for the inverter output to switch states increases. Given that phase noise is generated during the switch, it can be seen that this aspect of the invention affords phase noise advantages over the prior art ring-type VCO designs.

Figure 6:
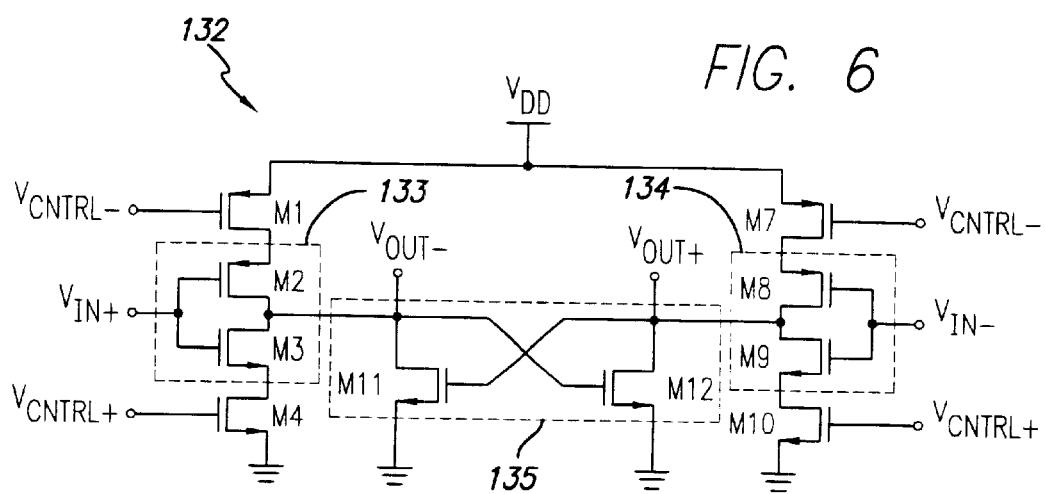
FIG. 6 is a schematic diagram of an alternative embodiment of a delay stage for the circuit of FIG. 2, in accordance with the invention.

An alternative embodiment for delay stages 32A and 32B of FIG. 2 is delay stage 132 shown in FIG. 6. Delay stage 132 is the same as delay stage 32 of FIG. 3, except for the design of memory element 135. Instead of using PMOS transistors M5 and M6 for the memory element 35 (FIG. 3), NMOS transistors M11 and M12 are used. NMOS transistors M11 and M12 each has its source terminal connected to ground. NMOS transistor M11 receives at its gate differential output $V_{OUT+}$ (or in other words, the output of CMOS inverter 134), and similarly, NMOS transistor M12 receives at its gate differential output $V_{OUT-}$ (or in other words, the output of CMOS inverter 135). NMOS speeds are typically 2.5 to 3.0 times faster than PMOS speeds. As such, the design of FIG. 6 offers faster switching. However, NMOS devices have the drawback of having larger flicker noise. For example, flicker noise may be ten times greater in NMOS than in PMOS. Thus, whether the design of FIG. 6 is preferable to that of FIG. 3 depends on the process used and phase noise design constraints.

Figure 7:
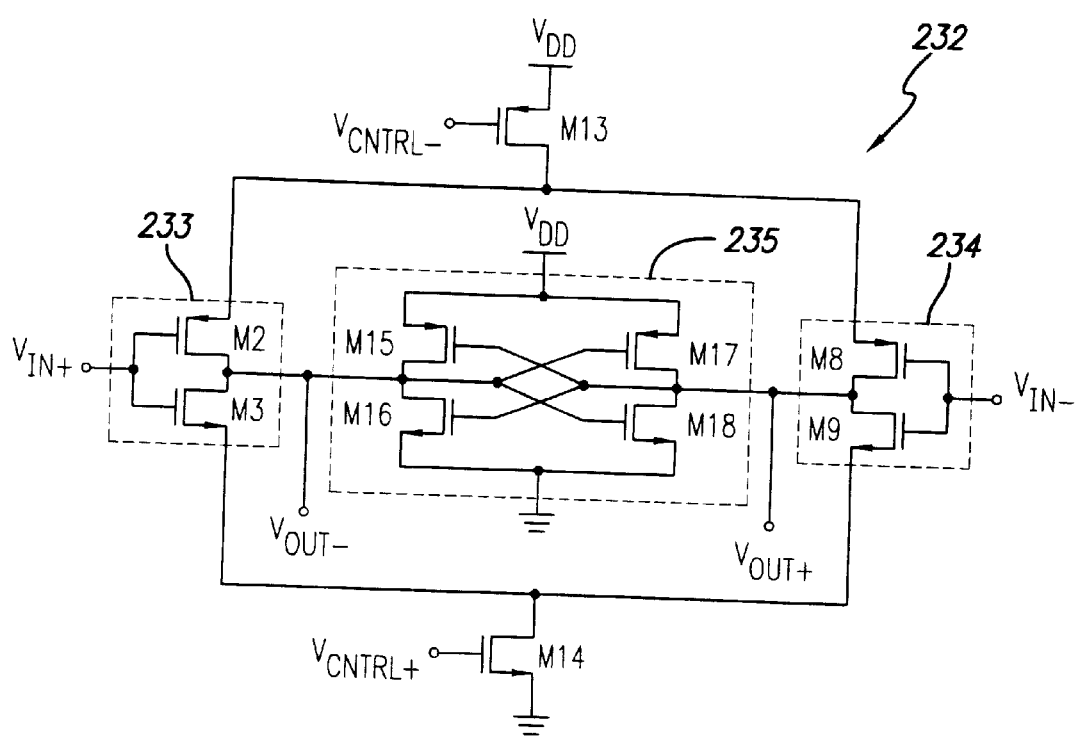
FIG. 7 is a schematic diagram of a second alternative embodiment of a delay stage for the circuit of FIG. 2, in accordance with the invention.

A second alternative embodiment for delay stages 32A and 32B of FIG. 2 is delay stage 232 shown in FIG. 7. Delay stage 232 includes two CMOS inverters 233 and 234, in similar fashion to delay stage 32 of FIG. 3. Delay stage 232 of FIG. 7 differs from delay stage 32 of FIG. 7 in two respects. First, there are common tuning transistors M13 and M14 for CMOS inverters 232. Specifically, the drain terminal of PMOS tuning transistor 13 is connected both to the source of PMOS transistor M2 of CMOS inverter 233 and to the source of PMOS transistor M8 of CMOS inverter 234. Also, the drain terminal of NMOS tuning transistor 13 is connected both to the source of NMOS transistor M3 of CMOS inverter 233 and to the source of NMOS transistor M9 of CMOS inverter 234. The common tuning transistors serves to reduce noise by reducing device count.

The second difference from the FIG. 3 delay stage 32 lies in the design of memory element 235. The memory element 235 includes two PMOS transistors M15 and M17 and two NMOS transistors M16 and M18. The source terminals of the PMOS transistors M15 and M17 are connected to power supply $V_{DD}$. The drain of PMOS transistor M15 is connected to the drain of NMOS transistor M16, as well as to the output of inverter 233 (and hence $V_{OUT-}$). The source of NMOS transistors M16 and M18 are connected to ground. The drain of PMOS transistor M17 is connected to the drain of NMOS transistor M18, as well as to the output of inverter 234 (and hence $V_{OUT+}$). One advantage of the memory element 235 is that it is symmetrical, and so the waveforms it produces will likewise be much more symmetrical. This is necessary in some applications, for example, mixers, that require absolute symmetry. The drawbacks of the FIG. 7 memory element 235 design are the increased number of devices in the memory element 235, which reduces switching speed and adds noise.

A number of embodiments of the invention have been described. Nevertheless, it will be understood that various modifications may be made without departing from the spirit and scope of the invention. For example, aspects of the invention may apply even where delay stages have non-differential inputs and non-differential outputs. Similarly, aspects of the invention may apply even where differential control is not used, in which case the tuning transistors (for example, M1, M4, M7 and M10) would not all be used, and instead for example, only M1 and M7 would be used, or alternatively, only M4 and M10. Also, different numbers of delay stages are contemplated. Two stages, however, affords reduced phase noise owing to the fact that it will have fewer devices. Further yet, although the invention relates particularly to CMOS process, it may have applicability to other processes. Accordingly, other embodiments are within the scope of the following claims.

What is claimed is:

1. A ring-type voltage-controlled oscillator comprising a plurality of delay stages with delays dependent upon a received control voltage, wherein at least one of the delay stages comprises:

an inverter that receives a signal from another of the delay stages and produces an output signal that will be received by another of the delay stages;

a memory element coupled to the output of the inverter, the memory element delaying the time before the output signal of the inverter begins to switch states in response to a switch in state of the received signal; and a tuning circuit coupled with the inverter, the tuning circuit receiving the control voltage and in response thereto, altering the strength of the inverter so as to alter the time delay before the output signal of the inverter begins to switch states, without also altering the strength of the memory element so as to substantially alter the time it takes for the output signal to switch states.

2. The ring-type voltage-controlled oscillator of claim 1, wherein:

the oscillator is realized in a CMOS process; and the inverter is a CMOS inverter.

3. The ring-type voltage controlled oscillator of claim 2, wherein the tuning circuit comprises a MOS transistor operating as a variable resistor coupled in series with the CMOS inverter, wherein varying the control voltage received at the gate of the MOS transistor varies the voltage drop from source to source across the CMOS inverter at a time when the signal received by the inverter is changing status.

4. A delay stage for a CMOS ring-type voltage-controlled oscillator, the delay stage comprising:

a first CMOS inverter that receives a first differential input signal and produces a first differential output signal;

a second CMOS inverter that receives a second differential input signal and produces a second differential output signal;

a memory element coupled to the outputs of both the first inverter and the second inverter, the memory element delaying the time before the first differential output signal begins to switch states in response to a switch in state of the first differential input signal, the memory element also delaying the time before the second differential output signal begins to switch states in response to a switch in state of the second differential input signal; and a tuning circuit coupled with the first CMOS inverter and the second CMOS inverter, the tuning circuit receiving a control voltage and in response thereto, altering the strength of the first and the second inverters so as to alter the time delay before the respective differential output signal of the inverter begins to switch states, without also altering the strength of the memory element so as to substantially alter the time it takes for the differential output signals to switch states.

5. The delay stage of claim 4, wherein:

the control voltage comprises first and second differential control voltages; and the tuning circuit comprises:

first and second PMOS transistors each receiving at their gates the first differential control voltage, the first PMOS transistor coupled in series with the first CMOS inverter, and the second PMOS transistor coupled in series with the second CMOS inverter; and first and second NMOS transistors each receiving at their gates the second differential control voltage, the first NMOS transistor coupled in series with the first CMOS inverter, and the second NMOS transistor coupled in series with the second CMOS inverter; and wherein varying the differential control voltage varies the voltage from source to source across the CMOS inverters at a time when the signal received by the CMOS inverters is changing states.

6. The delay stage of claim 4, wherein:

the control voltage comprises a first and a second differential control voltages; and the tuning circuit comprises:

a PMOS transistor receiving at its gate the first differential control voltage, and the PMOS transistor having its drain coupled to the sources of the PMOS transistors of both the first and the second CMOS inverters; and a NMOS transistor receiving at its gate the second differential control voltage, and the NMOS transistor having its drain coupled to the source of the NMOS transistors of both the first and the second CMOS inverters; and wherein varying the differential control voltages varies the voltage from source to source across the CMOS inverters at a time when the signal received by the CMOS inverter is changing states.

7. The delay stage of claim 4, wherein the memory element comprises first and second PMOS transistors, the gate of the first PMOS transistor coupled to the drain of the second PMOS transistor and also to the second differential output signal, the gate of the second PMOS transistor coupled to the drain of the first PMOS transistor and also to the first differential output signal, and the sources of the first and the second PMOS transistors coupled together and tied to the power supply voltage.

8. The delay stage of claim 4, wherein the memory element comprises first and second NMOS transistors, the gate of the first NMOS transistor coupled to the drain of the second NMOS transistor and also to the second differential output signal, the gate of the second NMOS transistor coupled to the drain of the first NMOS transistor and also to the first differential output signal, and the sources of the first and the second NMOS transistors coupled together and tied to ground voltage.

9. The delay stage of claim 4, wherein the memory element comprises first and second PMOS transistors, the gate of the first PMOS transistor coupled to the drain of the second PMOS transistor and also to the second differential output signal, the gate of the second PMOS transistor coupled to the drain of the first PMOS transistor and also to the first differential output signal, and the sources of the first and the second PMOS transistors coupled together and tied to the power supply voltage; and first and second NMOS transistors, the gate of the first NMOS transistor coupled to the drain of the second NMOS transistor and also to the second differential output signal, the gate of the second NMOS transistor coupled to the drain of the first NMOS transistor and also to the first differential output signal, and the sources of the first and the second NMOS transistors coupled together and tied to ground voltage.

* * * * *